(12) United States Patent
Fung

(10) Patent No.: US 8,305,148 B2
(45) Date of Patent: Nov. 6, 2012

(54) BIAS POINT SETTING FOR THIRD ORDER LINEARITY OPTIMIZATION OF CLASS A AMPLIFIER

(75) Inventor: Gregory A. Fung, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 67 days.

(21) Appl. No.: 12/959,970

(22) Filed: Dec. 3, 2010

(65) Prior Publication Data
US 2012/0139642 A1  Jun. 7, 2012

(51) Int. Cl.
*H03F 3/68* (2006.01)
(52) U.S. Cl. ........................................ 330/311
(58) Field of Classification Search .................. 330/311, 330/285, 296
See application file for complete search history.

(56) References Cited

U.S. PATENT DOCUMENTS

| | | | |
|---|---|---|---|
| 4,480,201 A * | 10/1984 | Jaeschke | 327/375 |
| 4,706,038 A | 11/1987 | Navidi et al. | |
| 5,982,201 A | 11/1999 | Brokaw et al. | |
| 6,531,924 B2 | 3/2003 | Aparin | |
| 6,744,322 B1 * | 6/2004 | Ma et al. | 330/300 |
| 6,861,909 B1 * | 3/2005 | Kobayashi | 330/311 |
| 7,355,480 B2 * | 4/2008 | Honda | 330/296 |

FOREIGN PATENT DOCUMENTS

EP   1 978 635 A1   10/2008

OTHER PUBLICATIONS

International Search Report and Written Opinion, 12 pages.

* cited by examiner

*Primary Examiner* — Robert Pascal
*Assistant Examiner* — Khiem Nguyen
(74) *Attorney, Agent, or Firm* — Patent Law Group LLP; Brian D. Ogonowsky

(57) ABSTRACT

An actual linear amplifier distorts an input signal, such as an RF signal, and generates third order intermodulation (IM3) products. In an embodiment of a Class A amplifier, the linear amplifier is a bipolar, common emitter-configured (CE) transistor using a cascode transistor to provide a fixed collector bias voltage to the CE transistor. The CE transistor has a transconductance vs. base-emitter voltage ($V_{BE}$) characteristic which, when plotted, shows a transconductance that increases with an increasing $V_{BE}$ to a maximum, then drops, then tapers off, wherein there is an inflection point between the maximum transconductance and where the transconductance tapers off. A DC bias circuit provides a DC bias voltage to the base of the CE transistor that causes the CE transistor's operating point to track the inflection point over a range of temperatures. This operating point causes the IM3 products to be greatly reduced.

15 Claims, 4 Drawing Sheets

BIAS POINT SETTING FOR THIRD ORDER LINEARITY OPTIMIZATION OF CLASS A AMPLIFIER

FIELD OF THE INVENTION

This invention relates to a DC biasing technique for a bipolar, common emitter-connected (CE) transistor having its collector connected to another bias voltage via a cascode transistor and, in particular, to such a DC biasing technique that is designed to minimize third order intermodulation products generated by the CE transistor.

BACKGROUND

An actual "linear" amplifier, such as an RF amplifier, produces some distortion, such as generating second and third harmonics of the fundamental frequency, generating frequency-mixed signals, and generating intermodulation products. For example, a "linear" amplifier receiving sine waves $f_1$ and $f_2$ will output the following signals of various magnitudes. The second and third order signals are output due to distortion:

| TERM | OUTPUT | FREQUENCY |
|---|---|---|
| linear | fundamental | $f_1, f_2$ |
| $2^{nd}$ order | $2^{nd}$ harmonic | $2f_1, 2f_2$ |
| $3^{rd}$ order | $3^{rd}$ harmonic | $3f_1, 3f_2$ |
| $2^{nd}$ order | frequency mixing | $(f_2 - f_1), (f_2 + f_1)$ |
| $3^{rd}$ order | $3^{rd}$ order intermod. products | $(2f_2 - f_1), (2f_1 - f_2)$ |

The output current of the amplifier can be described by the following power series, limited to the third order:

$$i_{out} = g_{m1}Vin + g_{m2}Vin^2 + g_{m3}Vin^3, \quad \text{eq. 1}$$

where the expansion coefficients $g_{m1}, g_{m2}, g_{m3}$ are equal to:

$$g_{m1}(Vin) = dI_{out}/dV_{in}$$

$$g_{m2}(Vin) = \tfrac{1}{2}d^2I_{out}/dV^2_{in} = \tfrac{1}{2}dg_{m1}/dV_{in}$$

$$g_{m3}(Vin) = \tfrac{1}{6}d^3I_{out}/dV^3_{in} = \tfrac{1}{3}dg_{m2}/dV_{in}$$

Here, $g_{m1}Vin$ is the linear amplification term, $g_{m2}Vin^2$ corresponds to the second order and mixing products, and $g_{m3}Vin^3$ represents the third order and intermodulation products. The third order intermodulation (IM3) products are the most problematic since they may occur near a fundamental frequency and may be difficult to filter out.

In many applications where signal fidelity is the paramount goal, a Class A amplifier is the logical choice. The applicable Class A amplifier in this present disclosure is a bipolar, common emitter-connected transistor, referred to herein as a CE transistor. A Class A amplifier is always forward biased when amplifying an AC input signal. Therefore, a DC bias must be applied to the base of the CE transistor to keep it on at all expected levels of the AC signal to be amplified.

However, even when biased into Class A there are significant third order intermodulation (IM3) products produced by the inherent non-linearity of the CE transistor.

Therefore, what is desired is a technique to achieve an improved linearity of a Class A amplifier circuit by eliminating or mitigating the IM3 products.

SUMMARY

A DC biasing technique is described for biasing the base of a CE transistor in a Class A amplifier, where the CE transistor has a collector connected to a load via a cascode transistor. Instead of the DC biasing technique operating the transistor at an operating point that provides the greatest gain or speed, the present DC biasing technique provides a bias voltage to the base of the CE transistor that minimizes the IM3 products.

If the transconductance of the CE transistor is plotted against a rising base-emitter voltage of the transistor, the transconductance will rapidly rise until it hits a peak, then drop off and begin to taper to a relatively constant transconductance. There is an inflection point in this plot after the transconductance drops off and begins to taper. At this inflection point, the second derivative $d^2g_{m1}/dV^2_{be}$ is zero, and that inflection point is the operating point at which the third order term ($g_{m3}$) is zero. Hence, referring to eq. 1, at that point, the IM3 products are zero. The DC biasing technique of the present invention is designed to substantially generate such a bias voltage so the CE transistor operates around the inflection point over a range of temperatures and process variations to achieve a high linearity of the Class A amplifier. At this desired operating point, the gain is reduced, the device is slower (lower $f_t$), and the current density is extremely high. Cascoding the linearity critical CE transistor ameliorates these tradeoffs and makes this operating point tenable.

A Class A amplifier in accordance with the invention has been designed with speeds in excess of 1 GHz.

Various other embodiments are described.

BRIEF DESCRIPTION OF THE DRAWINGS

Elements that are the same or equivalent are labeled with the same numeral.

DETAILED DESCRIPTION

Figure 1:
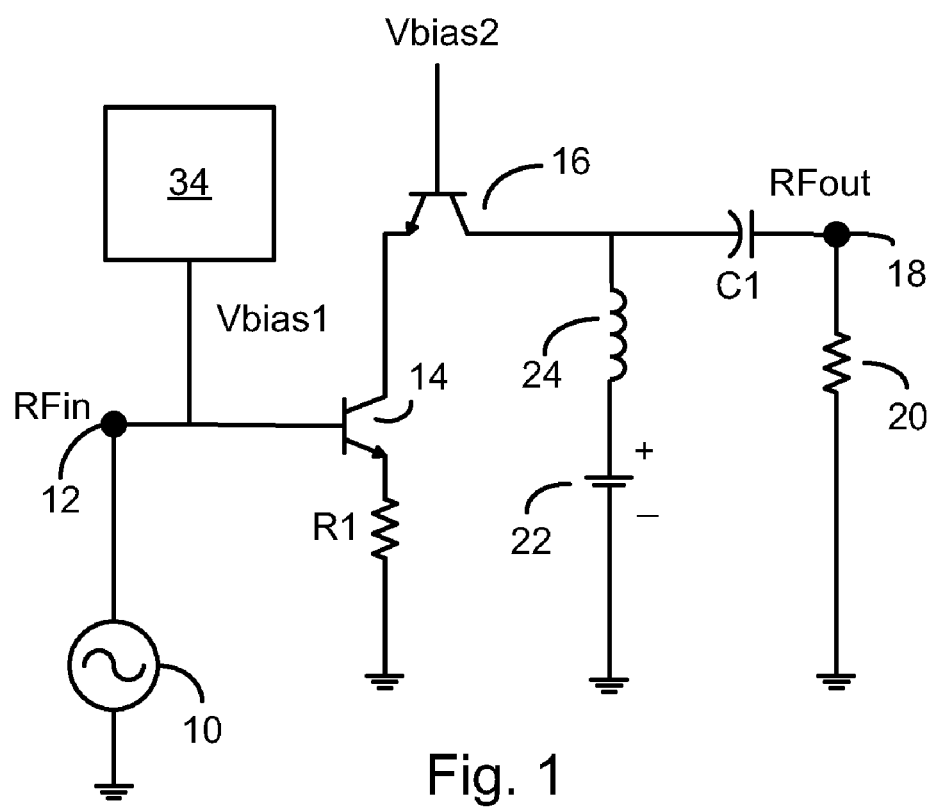
FIG. 1 illustrates a simplified Class A amplifier using a cascoded CE transistor in accordance with one embodiment of the invention.

FIG. 1 illustrates one embodiment of the invention. An external RF generator 10 applies a signal to an input terminal 12 of a Class A amplifier comprising a bipolar, common emitter-connected (CE) transistor 14 and a cascode transistor 16. The terminal 12 may be an input terminal of a packaged IC.

The CE transistor 14 has an emitter resistor R1 connected to ground. The cascode transistor 16 has its emitter connected to the collector of the CE transistor 14, and its collector connected to an output terminal 18 via an AC coupling capacitor C1. An external load 20 is represented as a resistor.

The collector of the cascode transistor 16 is biased by a voltage source 22 connected to the collector via an inductor 24 for DC coupling. A bias voltage (Vbias2) is connected to the base of the cascode transistor 16 for operating the cascode transistor 16 in its linear range and for providing a collector voltage to the CE transistor 14 via the base-emitter junction of the cascode transistor 16. The cascode transistor 16 causes the collector voltage of the CE transistor 14 to be fixed irrespective of the load 20 and causes the CE transistor 14 to only see a low output impedance irrespective of the load 20.

The use of the cascode transistor 16 results in the CE transistor 14 having more stable operating characteristics.

In a Class A amplifier, the transistors must be DC biased to be conducting at all levels of the expected input signal. Due to the constant DC current flowing through the Class A amplifier transistors, Class A amplifiers are inherently inefficient. Designers take steps to maximize the gain-speed performance by biasing the transistors with just enough current to meet their gain and speed/bandwidth goals.

Figure 2:
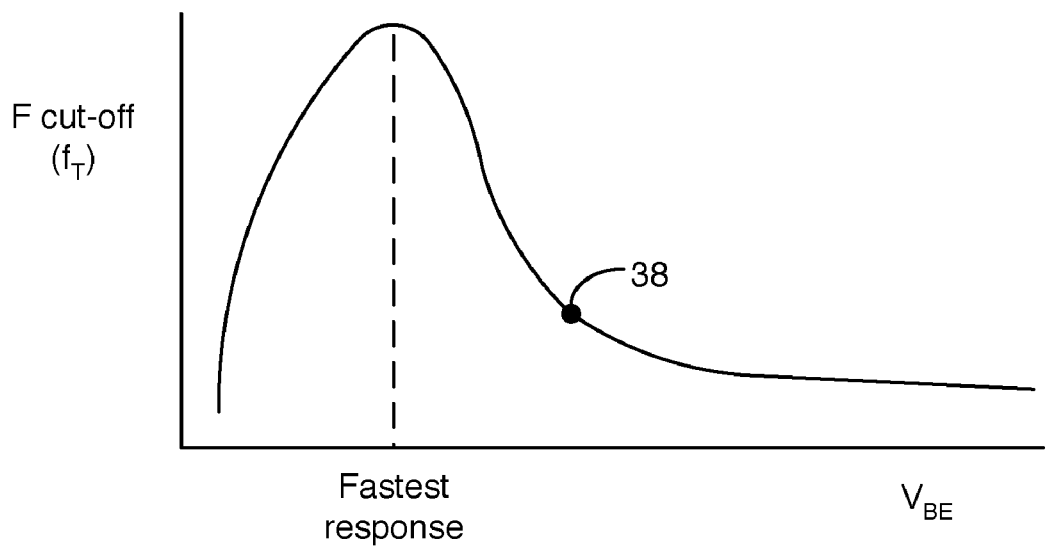
FIG. 2 plots the frequency cut-off ($f_t$) of the CE transistor of FIG. 1 vs. base-emitter voltage ($V_{BE}$).

FIG. 2 illustrates a typical frequency response curve of a CE transistor, where the y axis identifies the cut-off frequency ($f_T$) and the x axis identifies the base-emitter voltage ($V_{BE}$). There is an optimal DC biasing voltage for speed, where the transistor operates around the $V_{BE}$ (or associated collector-emitter current) that results in the highest $f_T$. Since collector current is an exponential function of $V_{BE}$, current density in the transistor rises rapidly as the transistor is biased to the right of the peak $f_T$.

Figure 3:
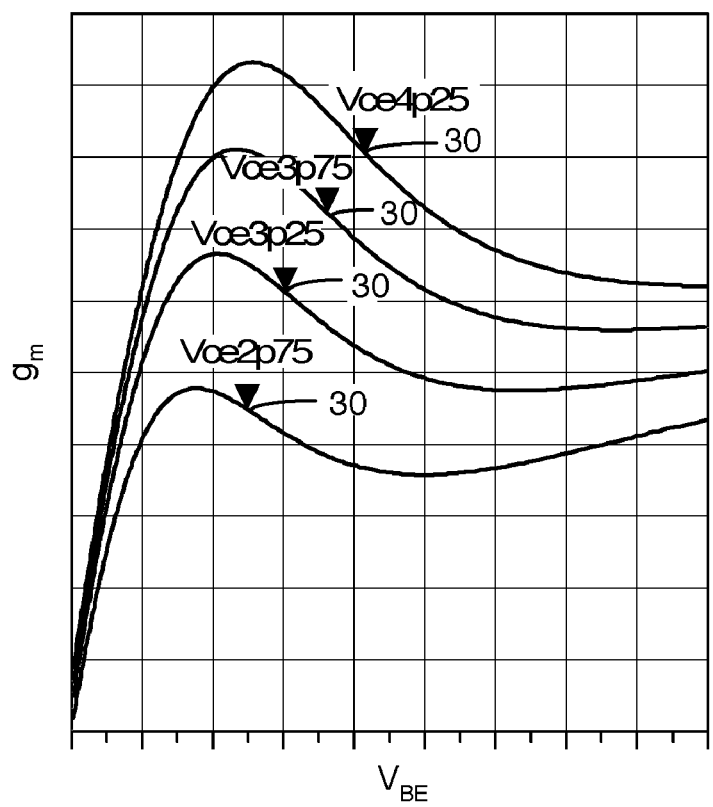
FIG. 3 plots the transconductance ($g_m$) vs. Vin ($V_{BE}$) of the CE transistor for different collector-emitter voltages.

Also, to maximize performance, the transistor's transconductance gain should be maximized. FIG. 3 illustrates a transistor's transconductance vs. $V_{BE}$ for four different collector-emitter voltages ($V_{CE}$). The curves shown are for $V_{CE}$'s of 2.75, 3.25, 3.75, and 4.25 volts. For each curve, the transconductance rises to a maximum, then drops off, then tapers out.

Designers generally want to bias the CE transistor 14 to optimize it for lowest current density, maximum gain, and fastest response to achieve maximum performance and bandwidth.

However, in some cases, achieving maximum linearity is desired. The present invention biases the CE transistor 14 to achieve improved linearity by reducing or eliminating its IM3 products.

Selecting the CE transistor 14 bias point is key to RF circuit performance. Inspection of the cutoff frequency ($f_T$) vs. $V_{BE}$ curve, shown in FIG. 2, of a typical Class A "linear" amplifier shows that the $f_T$ at first increases and then suddenly decreases as a function of $V_{BE}$. A corresponding curve can be drawn showing $f_T$ as a function of $I_{CE}$. The peak in $f_T$ is commonly referred to as the "$f_T$ crash point." Operating beyond this $V_{BE}$ or corresponding $I_{CE}$ reduces the speed/bandwidth (i.e., performance) of the device. Those skilled in the art will select a bias point to the left of the $f_T$ crash point, using just enough current to meet the speed/bandwidth requirement of the application.

A curve of $g_m$ (transconductance) vs. $V_{BE}$ for a typical Class A amplifier is shown in FIG. 3. The curve is similar to the $f_T$ vs. $V_{BE}$ curve since $f_T = g_m/2\pi C_{IN}$, where $C_{IN}$ is the input capacitance and is essentially constant. Further inspection of the $g_m$ vs. $V_{BE}$ curve shows an inflection point 30 well to the right of the $f_T$ crash point. We know that the $d^2 g_m/dV^2_{BE}$ is equal to zero at this inflection point. Further, $g_{m3} = \frac{1}{3} d^2 g_m/dV^2_{BE}$. Therefore, referring back to equation 1, we see that the IM3 products will go to zero at the inflection point.

This inflection point 30 is an attractive region to operate. The same inflection point 38 is also plotted on the curve of FIG. 2. However, this inflection occurs at a collector-emitter current ($I_{CE}$) nearly double the $f_T$ crash point, and this is not a reliable operating point due to power dissipation and the associated temperature rise concerns. Simulations of $g_m$ vs. $V_{BE}$ swept at differing $V_{CE}$'s show that the inflection point is a strong function of $V_{CE}$. Under a large signal drive, a common emitter (CE) amplifier's collector voltage moves about the load line as the $I_{CE}$ is modulated. Therefore, under large signal drive, a bare CE amplifier (without a cascode transistor) will not stay on this high current inflection point.

Cascoding the CE amplifier 14, using cascode transistor 16, overcomes the difficulties of operating at this high current inflection point 30/38. Firstly, the cascode transistor 16 effectively isolates the load 20 from the CE transistor 14. The cascode transistor 16 presents a low output impedance to the CE transistor 14, effectively fixing its collector voltage (irrespective of load current). Thus, we can stay on one of the curves in FIG. 3 for a particular $V_{CE}$.

Secondly, the power dissipation of the CE transistor 14 is greatly reduced. While the inflection point 30/38 occurs at a high current, the $V_{CE}$ can be kept arbitrarily low, where more than half the voltage drop occurs across the cascode transistor 16. Power dissipation in the CE transistor can be greatly reduced. Therefore, selection of a reliable operating point is possible.

Finally, cascoding the CE transistor 14 reduces the voltage swing on the CE transistor's output and reduces the effects of Miller capacitance multiplication. Bandwidth and speed are therefore improved, making up for much of the $f_T$ degradation as we operate past the $f_T$ crash point. As well, it has been found that a cascoding device can be easily sized and biased so that it does not degrade the linearity of the CE device.

The inflection point 30/38 at which the CE transistor 14 should operate around is set by a particular DC bias applied to the base of the CE transistor 14. This DC bias is set by the bias circuit 34 in FIG. 1, generating a Vbias1 voltage. The desired Vbias1 voltage for operating the CE transistor 14 near the inflection point is dependent on temperature and the collector-emitter voltage of the CE transistor 14. By using a cascode transistor 16, the collector-emitter voltage of the CE transistor 14 is assumed to be fixed.

The operating point indicated by point 30 causes the CE transistor 14 to operate at current densities that are much higher than typical. The Vbias2 applied to the base of the cascode transistor 16 can be used to limit the voltage across the CE transistor 14 and therefore limit power dissipation and associated temperature rise.

The point 30/38 is well to the right of the optimal collector-emitter current for the fastest response. At point 30/38, the current density is much higher than if the CE transistor 14 were operating at its highest gain/speed for fastest response.

Figure 4:
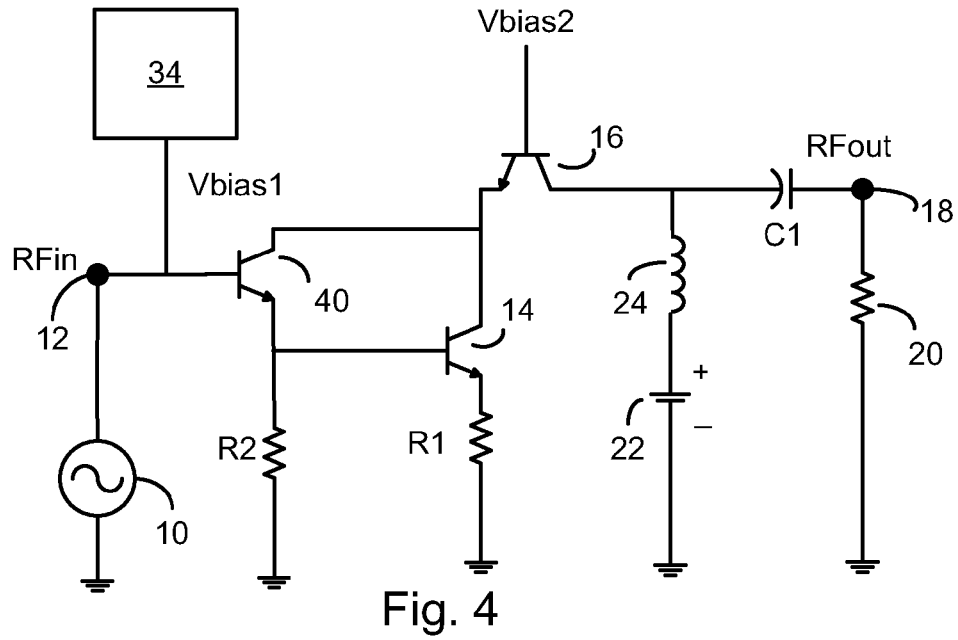
FIG. 4 illustrates another embodiment of a Class A amplifier using a compound Darlington transistor in accordance with the invention.
Figure 5:
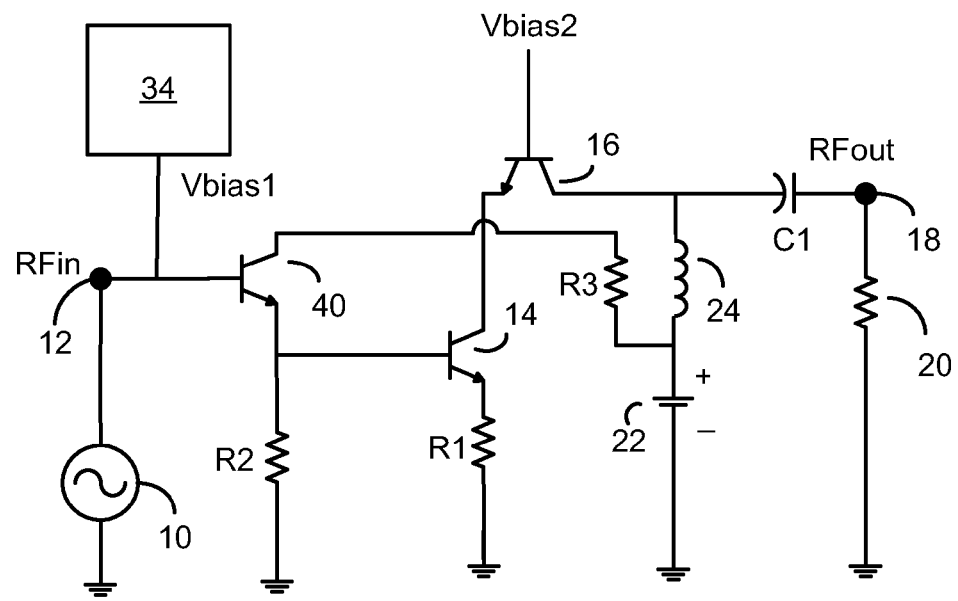
FIG. 5 illustrates another embodiment of a Class A amplifier using a cascoded CE transistor in accordance with the invention.

The Class A amplifier, using a CE transistor 14 and cascode transistor 16, may have many configurations, such as shown in FIGS. 4 and 5.

In FIG. 4, an input transistor 40 and emitter resistor R2 have been added, where transistors 40 and 14 comprise a compound transistor or Darlington pair. In FIG. 4, the collector of the transistor 40 is connected to the collector of the CE transistor 14 for DC biasing. The DC bias circuit 34 biases the base of the transistor 40, and the bias voltage for the CE transistor 14 is one $V_{BE}$ less than the voltage generated by the bias circuit 34.

In FIG. 5, transistor 40 has been added as an emitter follower. The collector of transistor 40 is connected to either the voltage source 22 via resistor R3 or connected direction to the top node of the inductor 24.

Figure 6:
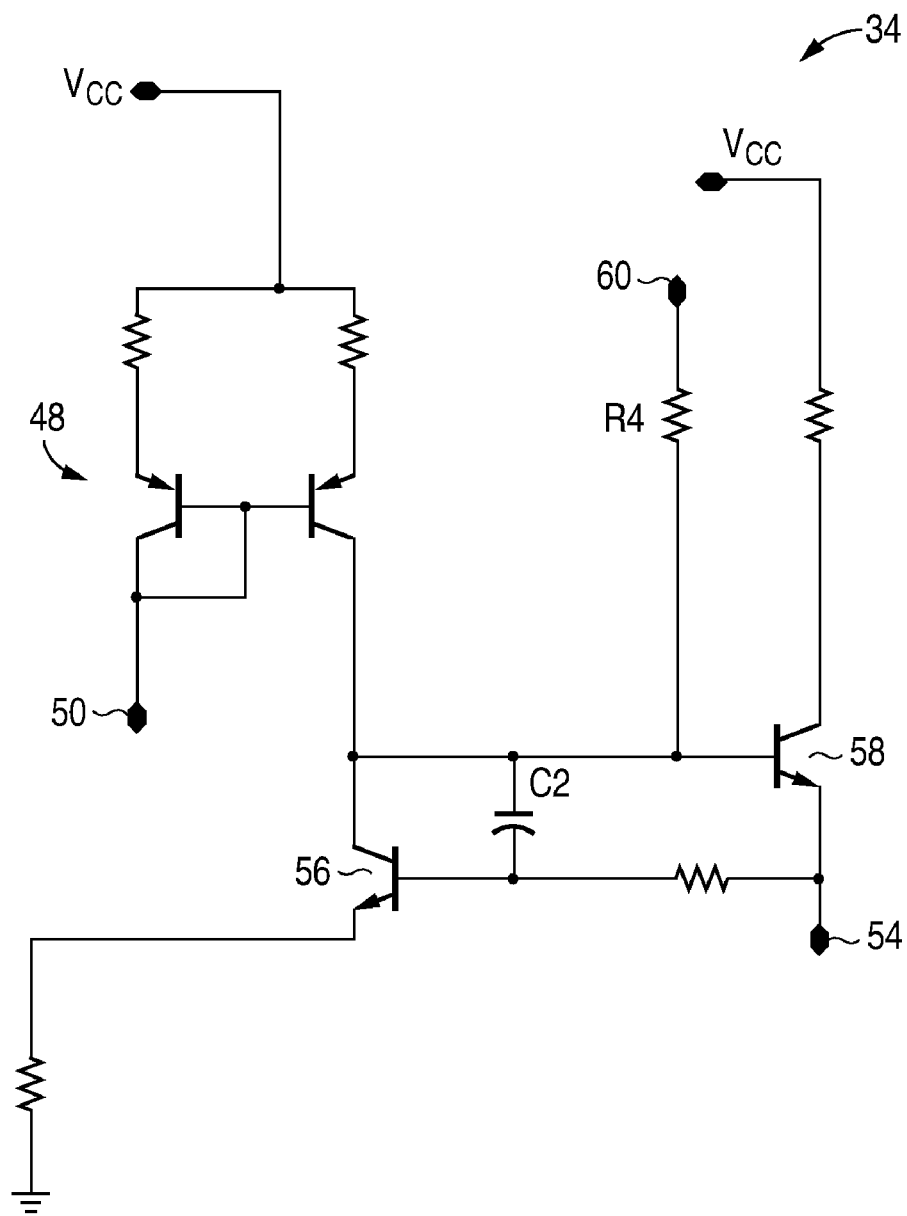
FIG. 6 illustrates one example of a DC bias circuit for biasing the CE transistor.

FIG. 6 is a simplified schematic of one embodiment of a DC bias circuit 34 that generates a DC bias voltage for operating the CE transistor 14 of FIG. 4. The bias voltage tracks temperature to cause the transistor 14 to operate near the inflection point 30 of its $g_m$ vs. $V_{BE}$ curve over a range of temperatures. Many other biasing circuits can be designed that deliver a bias voltage to the CE transistor 14 to cause it to operate around the inflection point 30/38 within a range of temperatures.

In FIG. 6, a scaled current mirror 48 has its current adjusted by turning on or off a number of parallel current sinks connected to node 50. The turning on or off of the current sinks is performed to set the bias voltage as close as practical to that needed for the CE transistor 14 to operate around the inflection point 30/38. In this mirror 48 circuit, transistor 56 is scaled to transistor 14 in FIG. 4 while transistor 58 is scaled to transistor 40 in FIG. 4. A constant current sink is attached to node 54 to mirror the $V_{BE}$ voltage of the Darlington driver transistor 40 in FIG. 4. In an actual circuit, the DC operating point may be approximately or substantially at the inflection point 30/38 while still achieving the advantages of the invention. A user may set the bias voltage using external pins of an integrated circuit package housing the Class A amplifier. Alternatively, the bias voltage may be set by a metal mask or other trimming techniques performed during manufacturing of the integrated circuit. The desired bias voltage setting may be determined empirically using test equipment during the test phase of the manufacturing process. Therefore, the bias voltage may be set precisely despite process variations.

As mentioned above, an adjustable current sink is connected to node 50. This current sink can be made slightly CTAT (complementary to absolute temperature) so that the CE transistor 14 tracks the inflection point 30/38 over a range of temperatures. A CTAT current reduces with increasing temperature. Many such CTAT current sources are well known and may be used, such as the CTAT current source described in U.S. Pat. No. 5,982,201, incorporated herein by reference. Capacitor C2 reduces noise from the bias circuit. The bias voltage is output at node 60. Note that resistor R4 is added for RF isolation, but an inductive choke could be substituted or added as well.

Additional circuitry may be connected between the various components shown in the figures, such as resistors or other components.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A Class A amplifier circuit comprising:
   a bipolar, common emitter-connected (CE) transistor having a base that receives a DC bias voltage and an AC signal to be amplified,
   wherein the CE transistor has a transconductance vs. base-emitter voltage ($V_{BE}$) characteristic which, when plotted, shows a transconductance that increases with an increasing $V_{BE}$ to a maximum, then drops, then tapers off, wherein there is an inflection point between the maximum transconductance and where the transconductance tapers off;
   a bipolar cascode transistor having an emitter coupled to a collector of the CE transistor, a collector of the cascode transistor providing an amplified AC signal; and
   a DC bias circuit coupled to provide a DC bias voltage to the base of the CE transistor, wherein the DC bias voltage is set to cause the CE transistor to substantially operate around the inflection point within a range of temperatures.

2. The circuit of claim 1 wherein the CE transistor is part of a Darlington pair, and wherein the DC bias voltage is applied to a first transistor in the Darlington pair.

3. The circuit of claim 1 wherein an RF signal is also coupled to the base of the CE transistor.

4. The circuit of claim 3 wherein operating the CE transistor around the inflection point mitigates third order intermodulation products caused by distortion by the CE transistor when amplifying the RF signal.

5. The circuit of claim 1 wherein the DC bias circuit forces the CE transistor to track the inflection point over temperature by varying the bias voltage with temperature.

6. The circuit of claim 5 wherein the DC bias circuit comprises a current mirror generating a current, where the current sets the bias voltage.

7. The circuit of claim 6 wherein the current is user-settable or settable by a manufacturing process.

8. A method of reducing third order intermodulation products produced by a Class A amplifier, the Class A amplifier comprising a bipolar, common emitter-connected (CE) transistor having a base that receives a DC bias voltage and an AC signal to be amplified, wherein the CE transistor has a transconductance vs. base-emitter voltage ($V_{BE}$) characteristic which, when plotted, shows a transconductance that increases with an increasing $V_{BE}$ to a maximum, then drops, then tapers off, wherein there is an inflection point between the maximum transconductance and where the transconductance tapers off, the Class A amplifier also comprising a bipolar cascode transistor having an emitter coupled to a collector of the CE transistor, a collector of the cascode transistor providing an amplified AC signal, the method comprising:
   providing a DC bias voltage to the base of the CE transistor, wherein the DC bias voltage is set to cause the CE transistor to substantially operate around the inflection point within a range of temperatures.

9. The method of claim 8 wherein the CE transistor is part of a Darlington pair, and wherein the DC bias voltage is applied to a first transistor in the Darlington pair.

10. The method of claim 8 further comprising also coupling an RF signal to the base of the CE transistor.

11. The method of claim 10 wherein operating the CE transistor around the inflection point mitigates third order intermodulation products caused by distortion of the CE transistor when amplifying the RF signal.

12. The method of claim 8 wherein providing the DC bias voltage that tracks the inflection point over temperature.

13. The method of claim 12 wherein the DC bias circuit comprises a current mirror generating a current, where the current sets the bias voltage.

14. The method of claim 13 further comprising setting the current generated by the current mirror.

15. The method of claim 14 wherein the current is user-settable or settable by a manufacturing process.

* * * * *